(12) United States Patent
Hwang

(10) Patent No.: US 8,542,543 B2
(45) Date of Patent: Sep. 24, 2013

(54) VARIABLE RESISTANCE MEMORY DEVICE HAVING EQUAL RESISTANCES BETWEEN SIGNAL PATHS REGARDLESS OF LOCATION OF MEMORY CELLS WITHIN THE MEMORY ARRAY

(71) Applicant: SK hynix Inc., Gyeonggi-do (KR)

(72) Inventor: Sang-Min Hwang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 13/844,899

(22) Filed: Mar. 16, 2013

(65) Prior Publication Data

US 2013/0215665 A1  Aug. 22, 2013

Related U.S. Application Data

(62) Division of application No. 12/899,985, filed on Oct. 7, 2010, now Pat. No. 8,456,930.

(51) Int. Cl.
*G11C 7/02* (2006.01)
(52) U.S. Cl.
USPC ............ 365/189.14; 365/189.15; 365/189.16; 365/158; 365/148; 365/163; 365/198

(58) Field of Classification Search
USPC ............ 365/158, 148, 163, 198, 191, 189.14, 365/189.15, 189.16, 189.17
See application file for complete search history.

(56) References Cited

U.S. PATENT DOCUMENTS

| | | | | |
|---|---|---|---|---|
| 6,985,376 B2 * | 1/2006 | Matsuoka | ...................... | 365/148 |
| 7,542,326 B2 * | 6/2009 | Yoshimura et al. | ........... | 365/148 |
| 7,787,281 B2 * | 8/2010 | Sheu et al. | ..................... | 365/148 |
| 7,920,405 B2 * | 4/2011 | Kang et al. | ..................... | 365/148 |

* cited by examiner

*Primary Examiner* — Andrew Q Tran
(74) *Attorney, Agent, or Firm* — IP & T Group LLP

(57) ABSTRACT

A memory device including variable resistance elements comprises a plurality of memory cells configured to store data; a first signal transmission/reception unit and a second signal transmission/reception unit configured to transmit a signal to the memory cells or receive a signal from the memory cells; a first transmission line arranged to couple first ends of the memory cells to the first signal transmission/reception unit; and a second transmission line configured to couple second ends of the memory cells to the second signal transmission/reception unit, wherein a first resistance of a first signal path coupled between the first and second signal transmission/reception units through a first memory cell of the memory cells is substantially equal to a second electrical resistance of a second signal path coupled between a second memory cell and the first and second signal transmission/reception units through a second memory cell of the memory cells.

8 Claims, 9 Drawing Sheets

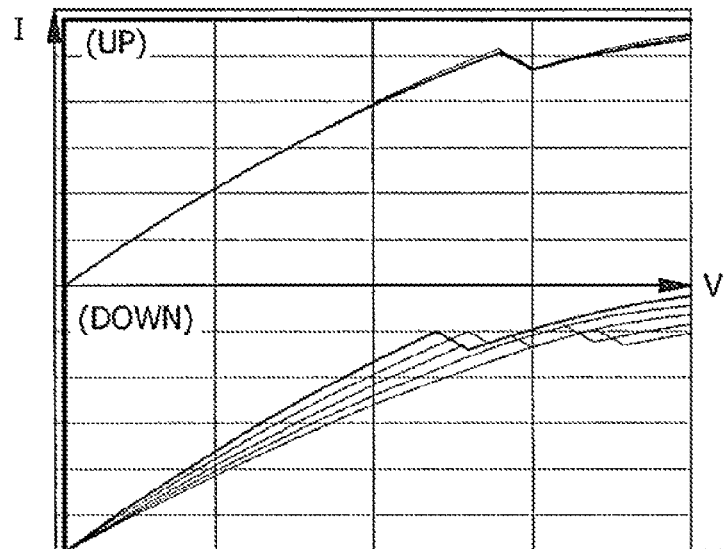
(a) WRITE
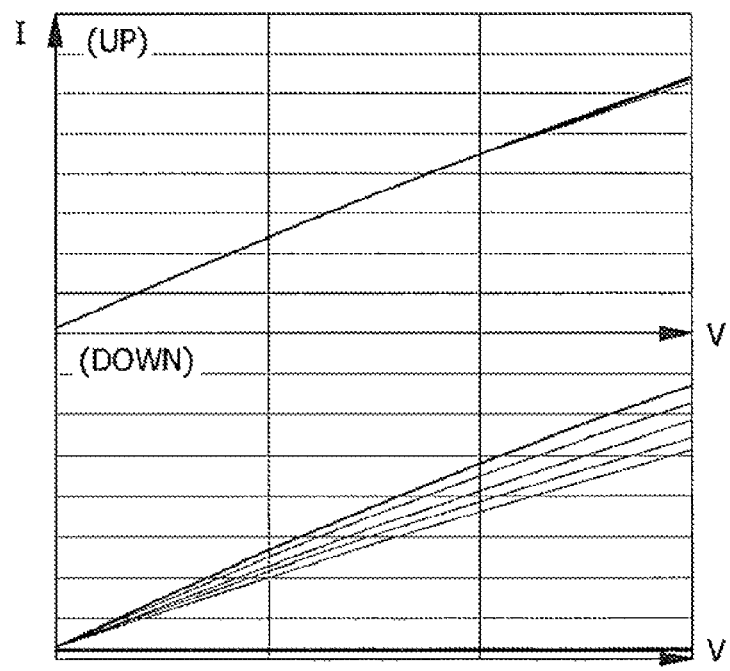
(b) READ

VARIABLE RESISTANCE MEMORY DEVICE HAVING EQUAL RESISTANCES BETWEEN SIGNAL PATHS REGARDLESS OF LOCATION OF MEMORY CELLS WITHIN THE MEMORY ARRAY

This application is a division of U.S. patent application Ser. No. 12/899,985 filed on Oct. 7, 2010. The disclosure of the foregoing application is incorporated herein by reference in its entirety.

BACKGROUND OF THE INVENTION

Exemplary embodiments of the present invention relate to a memory device including a variable resistance element.

A dynamic random access memory (DRAM) is a widely used semiconductor memory. However, there are limitations with respect to scalability and capacitance of a DRAM. To address such concerns, different types of memory devices are being developed. Examples include a magnetoresistive random access memory (MRAM) using tunneling magneto-resistance, and a phase-change random access memory (PRAM) using a resistance difference of a phase-change element.

An MRAM is a nonvolatile memory device using a magneto-resistance change that depends on magnetization directions of two ferromagnetic layers constituting a magnetic tunnel junction (MTJ). The MTJ has a stacked structure including a ferromagnetic layer, an insulation layer, and another ferromagnetic layer. At this time, one of the two ferromagnetic layers is a pinned layer (PL) whose magnetization direction is pinned, and the other is a free layer (FL) whose magnetization direction is changed by a current passing therethrough. When electrons tunneling through the first ferromagnetic layer pass through the insulation layer used as a tunneling barrier, the tunneling probability changes depending on the magnetization direction of the second ferromagnetic layer. That is, the tunneling probability is the highest when the magnetization directions of the two ferromagnetic layers are parallel to each other (that is, in the same direction) and is the lowest when the magnetization directions of the two ferromagnetic layers are anti-parallel to each other (that is, in the opposite directions). Therefore, stored data can be read by using a difference in current in two cases.

An MRAM relies on a spin transfer torque (STT) phenomenon in writing data to a memory cell. In a STT phenomenon, a spin-polarized current is transferred as an angular momentum of a ferromagnetic material due to a change of an angular momentum instantly generated when the spin-polarized current passes through the ferromagnetic material. That is, when a high-density current having a polarized spin direction is applied to a ferromagnetic material, data is written due to a phenomenon where a spin direction of a current is aligned (for example, changed) when a magnetization direction of a ferromagnetic material is not equal to a spin direction of a current.

In the MTJ used in a semiconductor memory, when electrons flow from a pinned layer to a free layer, a torque is generated to align the magnetization direction of the free layer by a flow of electrons whose spin directions are aligned in the magnetization direction of the pinned layer. Consequently, the magnetization direction of the free layer is parallel to the magnetization direction of the pinned layer at a certain current or more. On the other hand, when electrons flow from a free layer to a pinned layer, spin accumulation phenomenon occurs at an interface between the pinned layer and the free layer, so that the magnetization direction of the free layer is anti-parallel to the magnetization direction of the pinned layer. Therefore, data can be written in the magnetization direction of the free layer.

Meanwhile, a PRAM uses a special thin film, called chalcogenide. A chalcogenide alloy has a feature that its resistance increases at an amorphous phase and decreases at a crystal phase. Data is written by the control of the two phases.

A PRAM includes a chalcogenide compound and a resistance element, and an amorphous phase and a crystal phase are changed depending on a voltage applied thereto. A change from an amorphous phase to a crystal phase is achieved by applying a voltage for a certain time. A current flows between a chalcogenide compound and a resistance element. When the current continuously flows, Joule heat is generated in the resistance element. Thus, an atomic structure is reorganized and changes to the crystal change. On the other hand, a change from a crystal phase to an amorphous phase is achieved by a rapid cooling from a high temperature. To this end, a voltage is applied for a short time to generate Joule heat, and an applied voltage is rapidly lowered from the point of time when Joule heat is generated. Therefore, the phase change between the amorphous phase and the crystal phase is controlled by a time width of an applied pulse voltage.

SUMMARY OF THE INVENTION

An exemplary embodiment of the present invention is directed to a memory device including a variable resistance element, in which signal transmission paths have the same total electrical resistance, regardless of positions of the memory cells disposed within a memory cell array.

Another exemplary embodiment of the present invention is directed to a memory device including a variable resistance element, which supplies a constant bias current, regardless of positions of memory cells disposed within a memory cell array.

Another exemplary embodiment of the present invention is directed to a memory device including a variable resistance element, which can effectively control data of memory cells, while a driver supplying a bias voltage and current to the memory cells is formed at a smaller area.

In accordance with an exemplary embodiment of the present invention, a memory device with a variable resistance element includes: a plurality of memory cells configured to store data; a first signal transmission/reception unit and a second signal transmission/reception unit configured to transmit a signal to the memory cells or receive a signal from the memory cells; a first transmission line arranged to couple first ends of the memory cells to the first signal transmission/reception unit; and a second transmission line arranged to couple second ends of the memory cells to the second signal transmission/reception unit, wherein a first resistance of a first signal path coupled between the first and second signal transmission/reception units through a first memory cell of the memory cells is substantially equal to a second electrical resistance of a second signal path coupled between the first and second signal transmission/reception units through a second memory cell of the memory cells, wherein the first and second signal paths are formed by the first transmission line and second transmission line.

In accordance with another exemplary embodiment, a memory device including variable resistance elements comprising: a plurality of memory cells, each of the plurality of memory cells including a variable resistance element; a first write driving unit configured to transfer a first signal corresponding to a first write data to a terminal of the variable resistance element of a selected memory cell of the memory cells or receive a second signal corresponding to a second write data from the terminal of the variable resistance element; and a second write driving unit configured to transfer the second signal to the other terminal of the variable resistance element of the selected memory cell, or receive the first signal from the other terminal of the variable resistance element.

In accordance with another exemplary embodiment, a method includes: matching the total resistance of a first path coupled between a first signal transfer circuit and a second signal transfer circuit through a first memory cell with the total resistance of a second path coupled between the first signal transfer circuit and the second signal transfer circuit through a second memory cell, wherein the matching of the total resistance of the first and second paths includes providing a first difference between a resistance of a first transmission line forming a part of the first signal path and a resistance of the first transmission line forming a part of the second signal path; providing a second difference between a resistance of a second transmission line forming a part of the first signal path and a resistance of the second transmission line forming a part of the second signal path; and offsetting the first difference with the second difference so that the total resistance of the first signal path and the total resistance of the second signal path are equal.

BRIEF DESCRIPTION OF THE DRAWINGS

FIGS. 7A and 7B are graphs showing a current-voltage relationship for writing or reading data to or from a memory cell of the memory device in accordance with the exemplary embodiment of the present invention in comparison with the memory device of FIG. 1.

DESCRIPTION OF SPECIFIC EMBODIMENTS

Figure 1:
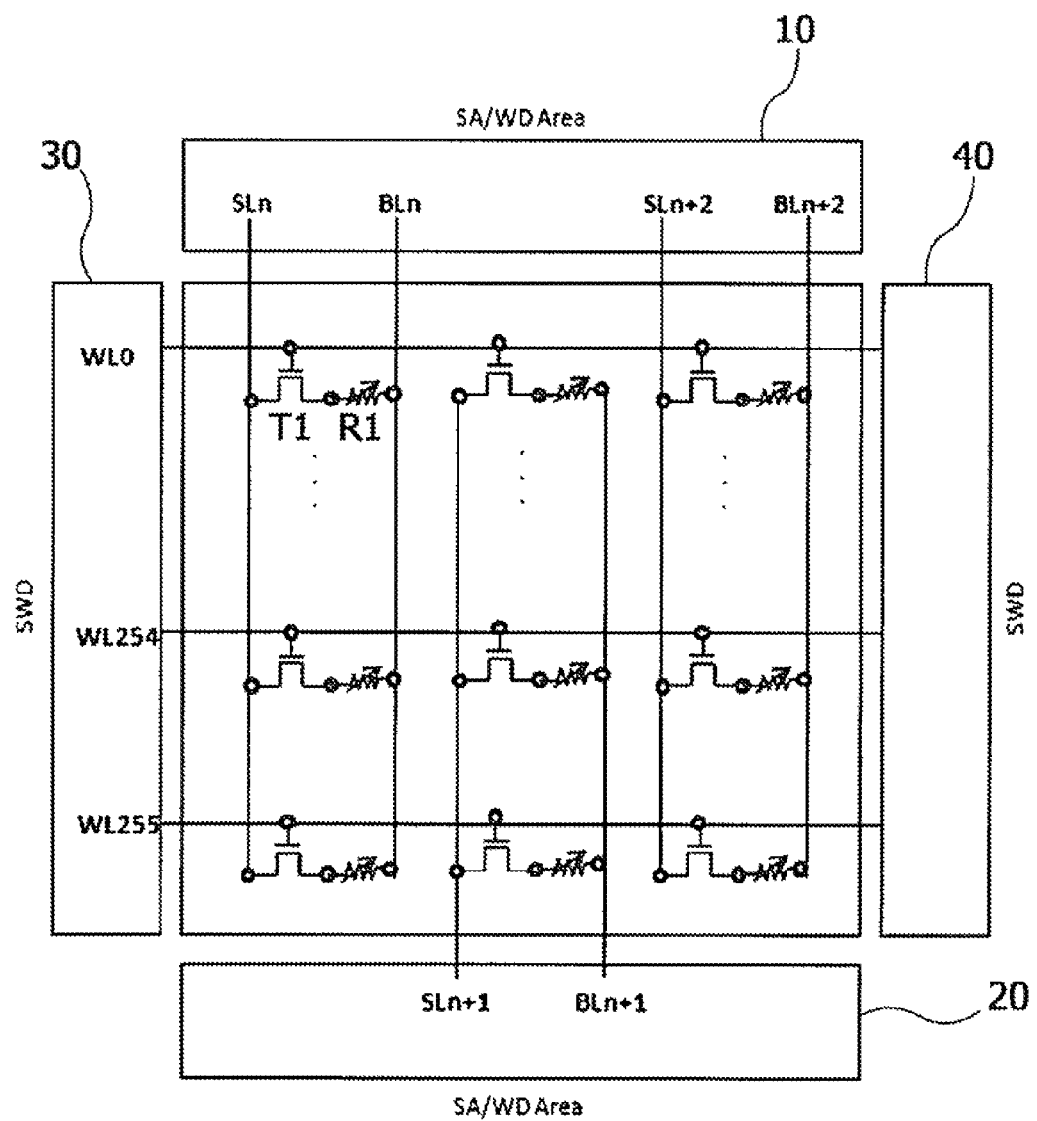
FIG. 1 is a diagram of a memory device including variable resistance elements.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
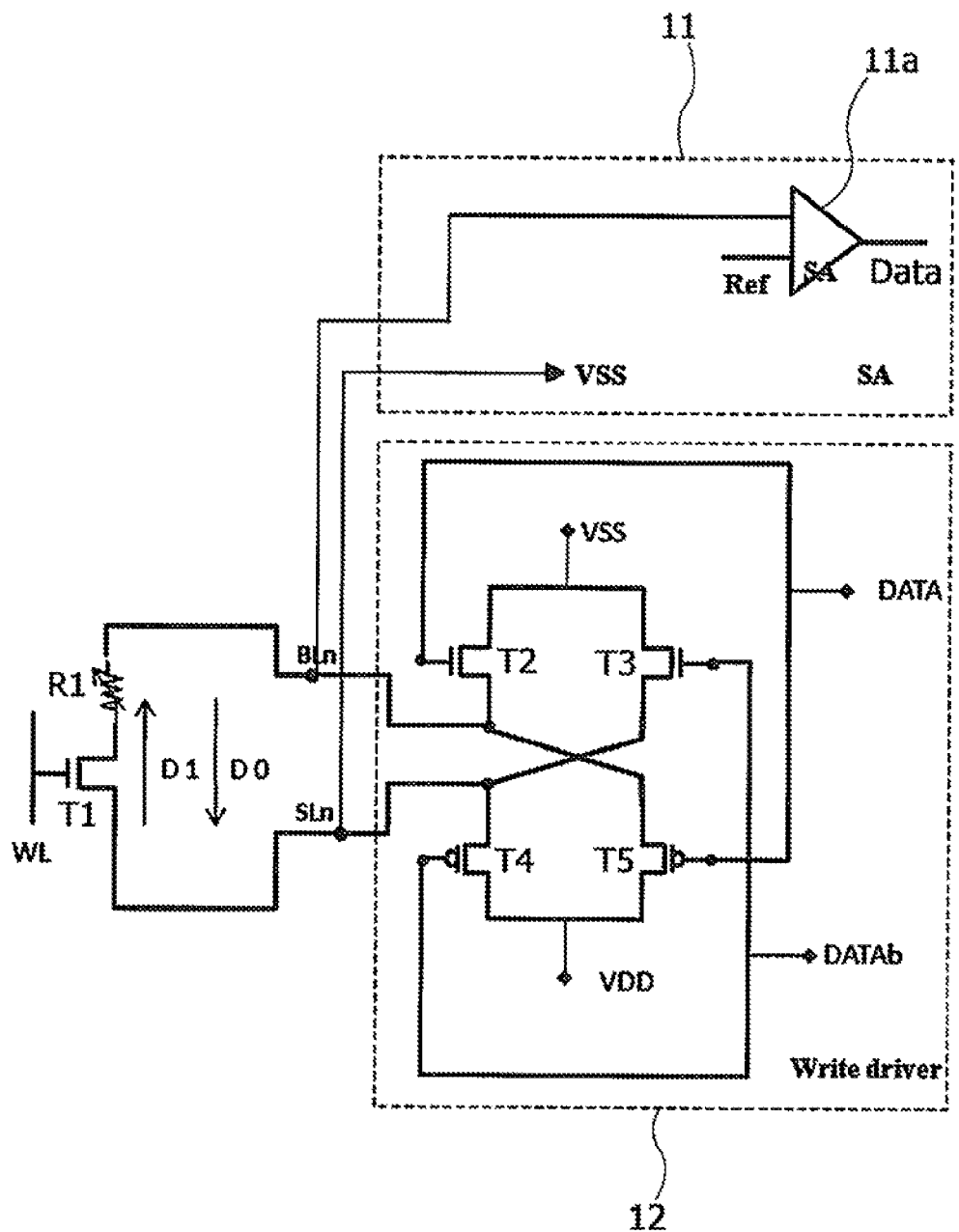
FIG. 2 is a diagram illustrating a bit line sense amplifier and a write driver of FIG. 1.
Figure 3:
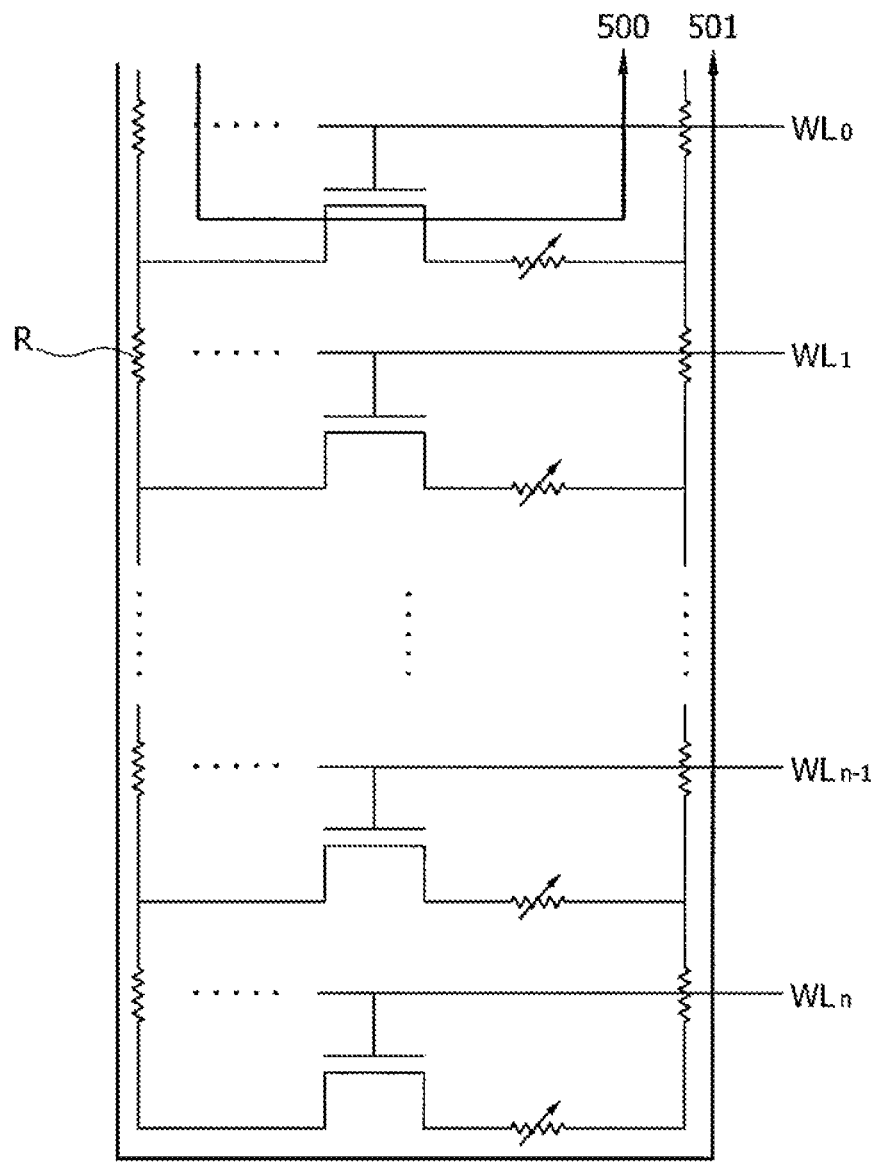
FIG. 3 is a diagram of the memory device in FIG. 1 in which transmission lines have electrical resistances.

FIG. 1 is a diagram of a memory device including a variable resistance element in a case where transmission lines are assumed to be ideal. FIG. 2 is a diagram illustrating a bit line sense amplifier and a write driver which are disposed in peripheral areas of a memory cell of FIG. 1. FIG. 3 is a diagram of a memory device including a variable resistance element in a case where transmission lines have electrical resistances.

Referring to FIG. 1, a plurality of memory cells each having a variable resistance element (e.g., R1) and a transistor (e.g., T1) are arranged in a matrix form. A plurality of word lines WL0 to WL255 are arranged to cross a memory cell area in one direction, for example, a horizontal direction. A plurality of bit lines $BL_n$ to $BL_{n+2}$ and a plurality of source lines $SL_n$ to $SL_{n+2}$ are arranged in another direction, for example, a vertical direction. Gates of the transistors of the memory cells constituting a single row are connected to a single word line. The word lines are connected to word line drivers 30 and 40. One ends of the transistors of the memory cells constituting a single column are commonly connected to a single source line, for example, $SL_n$. The variable resistance elements of the memory cells constituting a single column are commonly connected to a single bit line, for example, $BL_n$. The source lines and the bit lines are connected to peripheral areas 10 and 20 in which a bit line sense amplifier and a write driver (signal transfer units) are disposed.

FIG. 2 is a diagram illustrating the bit line sense amplifier 11 and the write driver 12 which are disposed in the peripheral areas 10 and 20. Referring to FIG. 2, the bit line sense amplifier 11 amplifies a difference between a reference signal Ref and a signal applied on the bit line $BL_n$, and outputs read data. The write driver 12 includes two PMOS transistors T4 and T5 and two NMOS transistors T2 and T3. The source line $SL_n$ is connected to a ground voltage terminal VSS.

In a memory cell array architecture using a variable resistance element, such as MRAM or PRAM, an ideal transmission line has no electrical resistance. Thus, as illustrated in FIG. 1, in such a case, the same bias current is transferred to any memory cell disposed within the memory cell array. However, in practice, there is parasitic resistance in a transmission line which causes a difference in applied bias currents to a signal path 500 of a memory cell disposed adjacent to a signal transmission unit and to a signal path 501 of a memory cell disposed farthest away from a signal transmission unit within the memory cell array, as illustrated in FIG. 3. For example, in comparing a signal path of a 1st memory cell on word line $WL_0$ with a signal path of a 256th memory cell on word line $WL_{256}$ in the memory cell array, when resistance of a source line and a bit line between a memory cell $WL_n$ and a memory cell $WL_{n+1}$ is R, the signal path of the 1st memory cell on word line $WL_0$ has a resistance of 2 R, and the signal path of the 256th memory cell on word line $WL_{256}$ has a resistance of 256×2 R. Thus, the total parasitic resistance is different for each signal path.

For example, in the case of an MRAM, a bias level applied across an MTJ is significantly different according to positions within the memory cell array. Hence, the last memory cell in the memory cell array (that is, a memory cell farthest away from a signal transmission unit) having the greatest parasitic resistance may be set as a reference for switching of all MTJs disposed within the memory cell array. As such, in order to transfer a bias current or voltage sufficient enough for the memory cell disposed farthest away from the signal transmission unit, a size of a driver which drives a current and voltage used to write data to the memory device may increase. Thus, an entire chip size may increase. Also, in a memory structure which determines data "1" and data "0" based on a difference in a variable resistance in a data read operation, parasitic resistance of a source line and a bit line may cause a reduction in resistance difference for data "1" and for data "0" and thus cause an error in sensing data.

Embodiment 1

Figure 4:
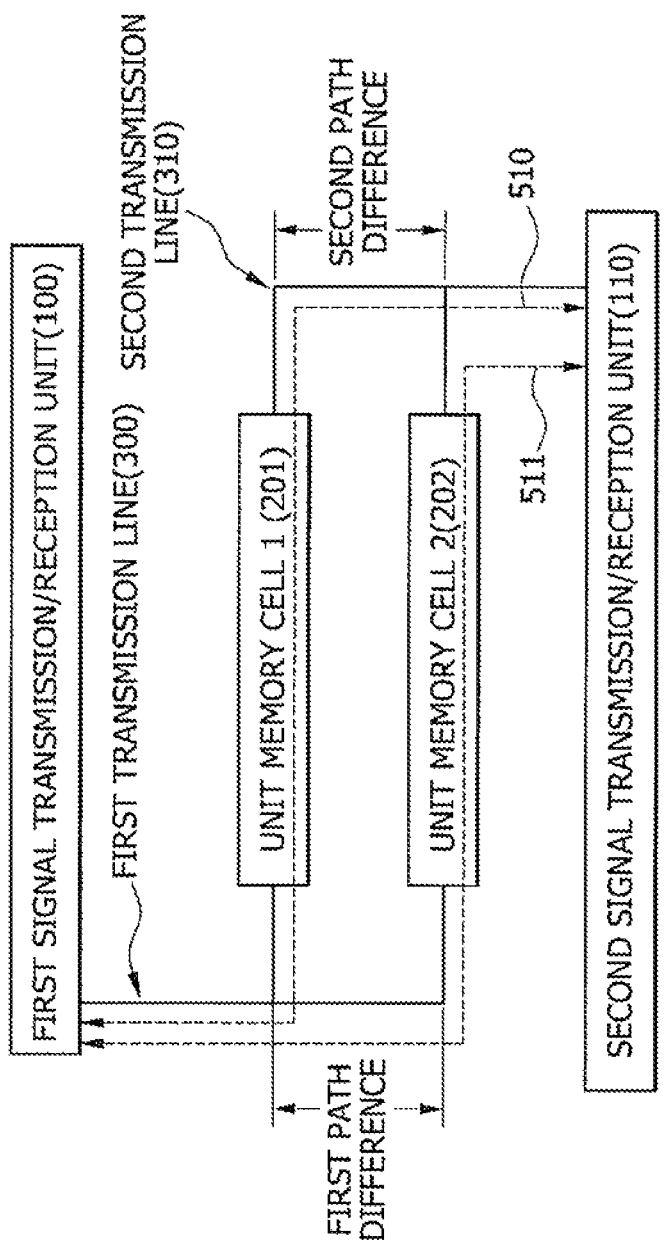
FIG. 4 is a schematic block diagram of a memory device including variable resistance elements in accordance with a first exemplary embodiment of the present invention.

FIG. 4 is a schematic block diagram illustrating a memory device including a variable resistance element in accordance with a first exemplary embodiment of the present invention.

Referring to FIG. 4, a memory cell array in accordance with a first exemplary embodiment of the present invention includes a first signal transmission/reception unit 100, a second signal transmission/reception unit 110, a first transmission line 300, and a second transmission line 310. The first signal transmission/reception unit 100 and the second signal transmission/reception unit 110 are configured to transmit or receive signals to read data stored in first and second memory cells 201 and 202 or write data to the first and second memory cells 201 and 202. The first transmission line 300 electrically connects one ends of the first and second memory cells 201 and 202 to the first signal transmission/reception unit 100. The second transmission line 310 electrically connects the other ends of the first and second memory cells 201 and 202 to the second signal transmission/reception unit 110. The first signal transmission/reception unit 100 and the second signal transmission/reception unit 110 are disposed in opposite sides of the memory cell array.

An operation characteristic of the memory cell array configured as above will be described below. First, the signal paths of the first and second memory cells 201 and 202 disposed at different positions of the same memory cell array will be described. For example, a signal path 510 is a path of a current or voltage signal from the first signal transmission/reception unit 100 to the second signal transmission/reception unit 110 through the first memory cell 201, and a signal path 511 is a path of a current or voltage signal from the first signal transmission/reception unit 100 to the second signal transmission/reception unit 110 through the second memory cell 202.

In the memory cell array having the above-described architecture, in comparing the signal path 510 from the first signal transmission/reception unit 100 to the first memory cell 201 with the signal path 511 from the first signal transmission/reception unit 100 to the second memory cell 202, the first transmission line 300 has a first path difference in length between the two paths, where, for example, the path length difference is proportional to resistances of the two paths, respectively. Also, in comparing the signal path 510 from the first memory cell 201 to the second signal transmission/reception unit 110 with the signal path 511 from the second memory cell 202 to the second signal transmission/reception unit 110, the second transmission line 310 has a second path difference in length between the two paths. For the entire signal path of the signal passing through the first memory cell 201 and the entire signal path of the signal passing through the second memory cell 202, a resistance difference between the two paths depends on the combined effects of the first path difference and the second path difference. Therefore, if the first path difference and the second path difference are equal and offset each other, the total electrical resistances of the signal paths 510 and 511 passing through the first and second memory cells 201 and 202 disposed at different positions within the same memory cell array become equal to each other.

Figure 5:
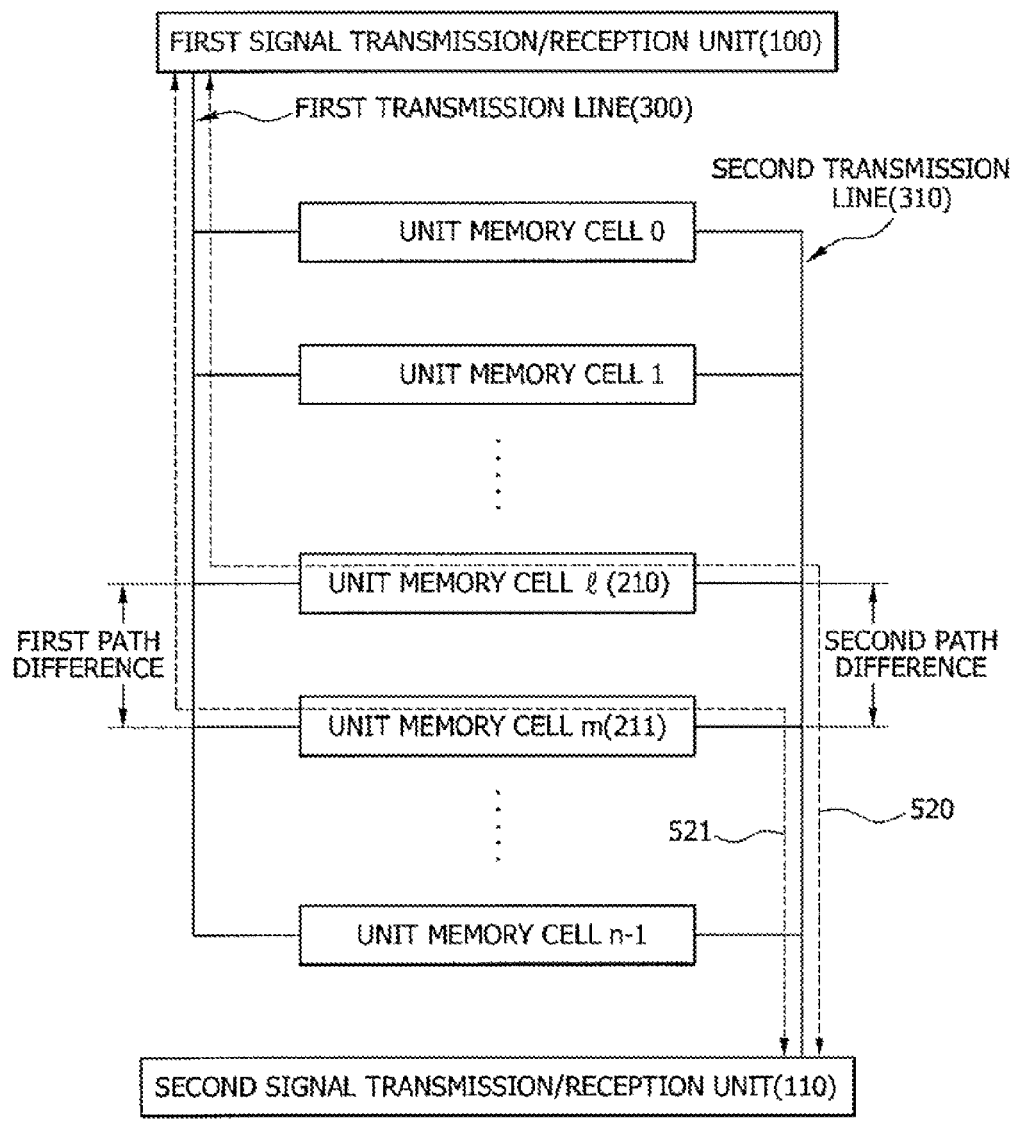
FIG. 5 illustrates a block diagram of the memory device in FIG. 4 in detail.

FIG. 5 is a block diagram illustrating an extended memory cell array having n memory cells.

As illustrated in FIG. 5, a plurality of memory cells may be arranged in parallel within a memory cell array. Each of the memory cells has an end electrically connected through a first transmission line 300 to a first signal transmission/reception unit 110, and the other end electrically connected through a second transmission line 310 to the second signal transmission/reception unit 110.

Considering signal paths formed between the first signal transmission/reception unit 100 and the second signal transmission/reception unit 110 in accessing an l-th memory cell 210 and an m-th memory cell 211 as an example, they form a signal path 520 and a signal path 521, respectively. A signal path difference existing between the signal path 520 and the signal path 521 at the section between the first signal transmission/reception unit 100 and the unit memory cells 210 and 211 and a signal path difference existing between the signal path 520 and the signal path 521 at the section between the unit memory cells 210 and 211 and the second signal transmission/reception unit 100 are a first path difference and a second path difference, respectively. If the electrical resistances of the first path difference and the second path difference are equal and offset each other, the total electrical resistances of the entire signal paths 520 and 521 passing through the l-th memory cell 210 and the m-th memory cell 211 become equal to each other, regardless of the positions of the memory cells. The same total electrical resistance characteristics of the l-th memory cell 210 and the m-th memory cell 211 may globally apply to all memory cells of the memory cell array so that the respective signal paths have the same total electrical resistance.

In the memory cell array having the above-described structure, a total parasitic electrical resistance of the signal path formed between the first signal transmission/reception unit 100 and the second signal transmission/reception unit 110 with respect to a memory cell within a memory cell array (that is, the signal path formed by the first transmission line 300 and the second transmission line 310) may be such that it is equal to a total parasitic electrical resistance of the signal path formed between the first signal transmission/reception unit 100 and the second signal transmission/reception unit 110 with respect to another memory cell within the same memory cell array (that is, the signal path formed by the first transmission line 300 and the second transmission line 310). Here, since the first transmission line 300 and the second transmission line 310 for all memory cells within the memory cell array are formed to have the same electrical resistance, the signal paths of the memory cells within the same memory cell array have the constant resistance value, regardless of their positions.

Embodiment 2

Figure 6:
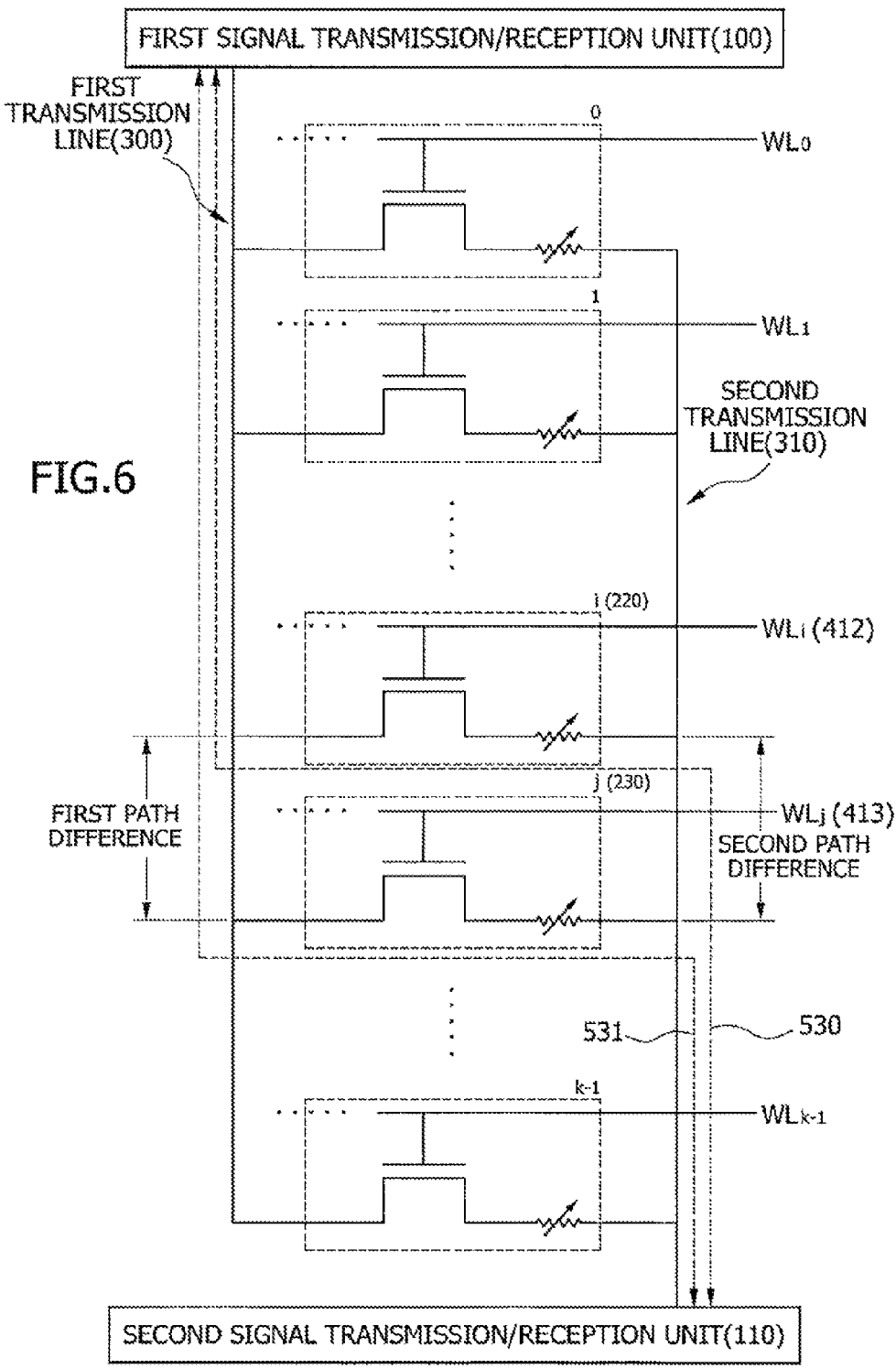
FIG. 6 is a diagram of a memory device including variable resistance elements in accordance with a second exemplary embodiment of the present invention.

FIG. 6 is a diagram illustrating a memory device including a variable resistance element in accordance with a second exemplary embodiment of the present invention, in which each of memory cells includes a variable resistance element and a transistor.

Referring to FIG. 6, the memory cell array includes k memory cells. Each of the memory cells includes a variable resistance element and an access transistor connected in series. The variable resistance element stores data, and the access transistor is electrically connected to the variable resistance element to control an access to the variable resistance element. Each of the memory cells has an end (for example, a source terminal of a transistor) connected through a first transmission line 300 to a first signal transmission/reception unit 100, and the other (for example, an end of the variable resistance element) connected through a second transmission line 310 to a second signal transmission/reception unit 110. Also, in the memory cells, control terminals of the access transistors are connected to word lines $WL_0, WL_1, \ldots, WL_{k-1}$, respectively. Thus, the on/off operation of the transistors can be controlled. Also, the first signal transmission/reception unit 100 and the second signal transmission/reception unit 110 may be disposed in opposite sides with respect to the memory cell array. For example, the first transmission line 300 constituting the source line and the second transmission line 310 constituting the bit line may be arranged in parallel within the memory cell array. Also, the word lines may be arranged perpendicular to the first transmission line 300 and the second transmission line 310.

In the memory cell array in accordance with the second exemplary embodiment of the present invention, features related to an i-th memory cell and a j-th memory cell are illustrated as an example. A signal path for accessing the i-th memory cell 220 is a signal path 530, and a signal path for accessing a j-th memory cell is a signal path 531. When both of the i-th memory cell 220 and the j-th memory cell 230 are controlled to be "on", the signal path for the first signal transmission/reception unit 100 to transmit a signal to access data of the memory cells will be described below. The signal path on the first transmission line 300 from the first signal transmission/reception unit 100 to an end of the i-th memory cell 220 is equal to the signal path on the second transmission line 310 from an end of the j-th memory cell 230 to the second signal transmission/reception unit 110. On the other hand, the signal path on the first transmission line 300 from the first signal transmission/reception unit 100 to an end of the j-th memory cell 230 is equal to the signal path on the second transmission line 310 from an end of the i-th memory cell 220 to the second signal transmission/reception unit 110. Hence, in the signal paths for accessing the i-th memory cell 220 and the j-th memory cell 230, total resistances for an overall first path (e.g., 530) and an overall second path (e.g., 531) may equal one another.

Therefore since the total electrical resistances in the first path (e.g., 530) and the second path (e.g., 531) equal one another, the signal paths of the i-th memory cell 220 and the j-th memory cell 230 have the same electrical resistance. When the electrical resistances of the first transmission line 300 and the second transmission line 310 have the same total resistance characteristics described above for all memory cells, memory cells constituting the memory cell array have the constant electrical resistance on the signal paths, regardless of their positions within the same memory cell array.

Therefore, the total electrical resistances on the signal transmission paths may be constant, regardless of the positions of the memory cells within the memory cell array, thereby reducing a variation in a threshold voltage of an access transistor. Consequently, a relatively uniform current or voltage may be applied across the variable resistance element.

FIGS. 7A and 7B are graphs illustrating a current-voltage relationship for writing or reading of a memory cell in the memory cell array in accordance with the exemplary embodiment of the present invention. Also, a current-voltage graph for writing or reading data for a memory cell in the memory cell in the memory device of FIG. 1 is also shown in FIGS. 7A and 7B.

As shown in the top half of FIG. 7A, in the memory cell array architecture in accordance with the exemplary embodiment of the present invention, current for writing data to the memory cells is almost the same for all memory cells. As shown in the bottom half of FIG. 7A, in the memory cell array architecture in accordance with FIG. 1 memory cell array, current for writing data to memory cells varies significantly. Similarly, as shown in the top half of FIG. 7B, in the memory cell array architecture in accordance with the exemplary embodiment of the present invention, current for reading data is almost the same for all memory cells regardless of the positions of the memory cells. As shown in the bottom half of FIG. 7B, in the memory cell array architecture in accordance with FIG. 1 memory cell array, current for reading data to memory cells varies significantly according to the positions of the memory cells.

As can be seen from FIGS. 7A and 7B, the memory cell array architecture in accordance with the exemplary embodiment of the present invention may stably read or write data from or to the memory cells. Furthermore, the memory cell array architecture in accordance with the exemplary embodiment of the present invention may use same current to memory cells for reading or writing data regardless of the positions of the memory cells within the memory cell array. Thus, a circuit area for a driver which supplies a current or voltage for, for example, a read operation, may be reduced, and the overall chip size may decrease. Also, when data is read using a difference between a current of a memory cell and a reference current, a current level from a memory cell in which data is written be the same regardless of the positions of the transmission lines (for example, bit lines) within the memory cell array.

Embodiment 3

Figure 8:
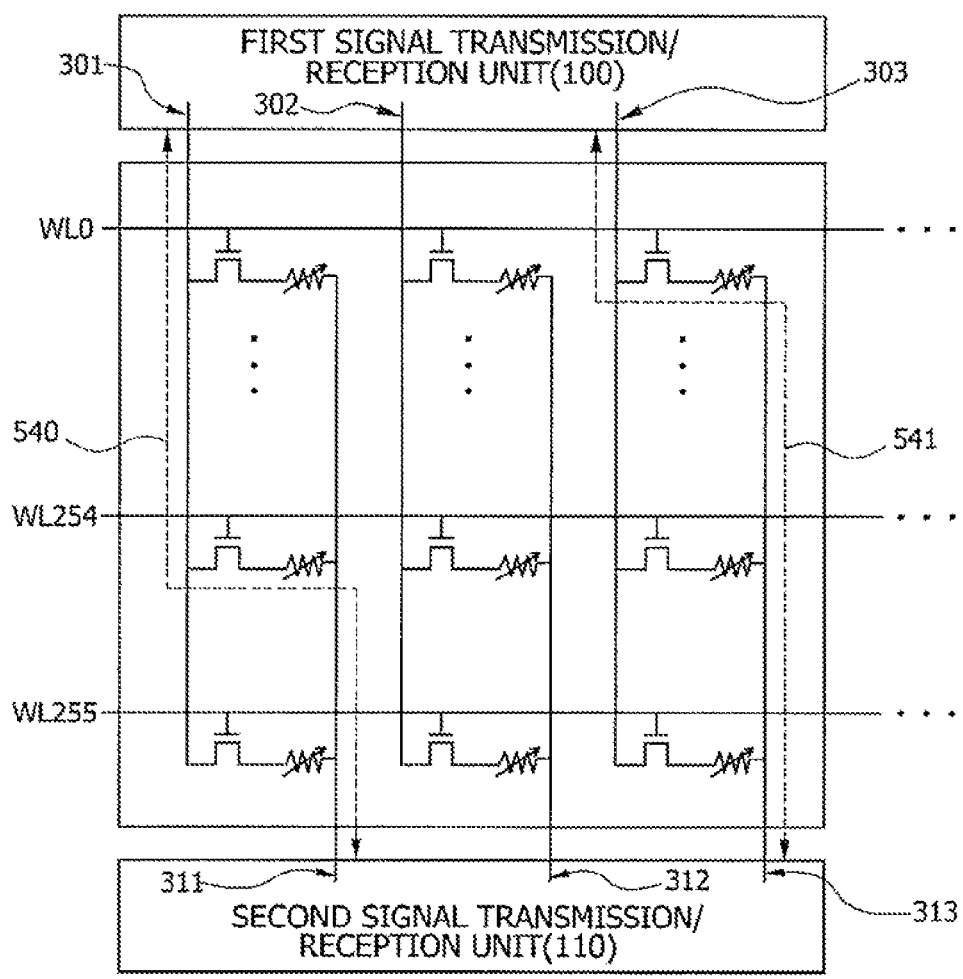
FIG. 8 is a schematic diagram of a memory device including variable resistance in accordance with a third exemplary embodiment of the present invention.

FIG. 8 is a diagram illustrating a memory device including a variable resistance element in accordance with a third exemplary embodiment of the present invention.

Referring to FIG. 8, each memory cell array may include 256 memory cells. Also, a first signal transmission/reception unit 100 and a second signal transmission/reception unit 110 are connected to first transmission lines 301, 302 and 303 and second transmission lines 311, 312 and 313 to transmit or receive signals for writing data to the memory cells or reading data from the memory cells. In addition, word lines $WL_0, \ldots, WL_{254}$ and $WL_{255}$ are connected to control terminals of access transistors within the adjacent memory cells. The first signal transmission/reception unit 100 and the second signal transmission/reception unit 110 are arranged in opposite sides with respect to a memory unit in which a plurality of memory cell arrays are formed. Moreover, the first transmission lines 301, 302 and 303 and the second transmission lines 311, 312 and 313 may be arranged in parallel to one another, and the word lines $WL_0, \ldots, WL_{254}$ and $WL_{255}$ may be arranged perpendicular to the first transmission lines 301, 302 and 303 and/or the second transmission lines 311, 312 and 313.

In the memory device having the above-described structure, each memory cell array may be arranged in the same manner as the first exemplary embodiment or the second exemplary embodiment. For example, as to a signal path 540 for accessing a memory cell within the memory cell array constituting the memory device a total parasitic resistance of the signal path 540 through which a signal is transferred from the first signal transmission/reception unit 100 to the second signal transmission/reception unit 110 (that is, a signal path through the first transmission line 301, the memory cell $WL_{254}$ and the second transmission line 311) is equal to a total parasitic resistance of the signal path 541 through which a signal is transferred from the first signal transmission/reception unit 100 to the second signal transmission/reception unit 110 (that is, a signal path through the first transmission line 303, the memory cell WL₀ and the second transmission line 313).

In other words, in the memory device, when the first transmission lines 301, 302 and 303 and the second transmission lines 311, 312 and 313 of the plurality of memory cell arrays formed within the memory unit are formed to have complementary electrical resistances so that any one complete path formed by a pair of them (e.g., 301 and 311) through any of the memory cells connected in-between has the same electrical resistance as described above in connection with FIG. 6 for the i-th and j-th memory cells, the memory cells may be arranged to have the same electrical resistance on the signal transmission paths, regardless of their positions within the memory cell arrays. Any one or more of the parasitic electrical resistances on the first and second transmission lines may be formed in the same way by forming the signal lines having the same dimensions and providing the same number of contact plugs for connecting transistors and corresponding variable resistance elements. According to an example, the total electrical resistances on complete paths (e.g., 301 and 311) through the first and second transmission lines may not be the same exactly but substantially equal to maintain a minimum variation width for accessing the memory cells.

Figure 9:
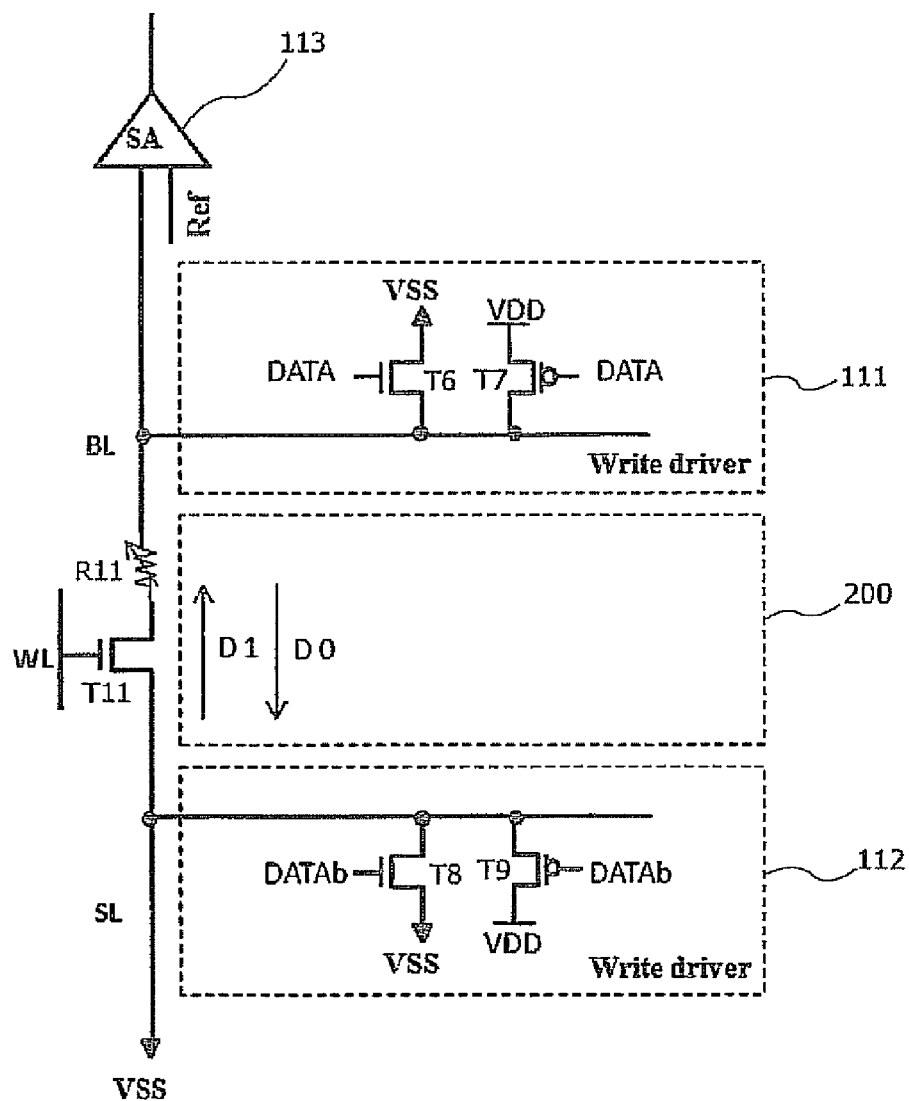
FIG. 9 is a diagram illustrating a bit line sense amplifier and a write driver of FIG. 8.

FIG. 9 is a diagram illustrating a bit line sense amplifier and a write driver of FIG. 8.

Referring to FIG. 9, a bit line sense amplifier 113 amplifies a difference between a reference signal Ref and a signal applied on a bit line BL, and outputs read data. Two write drivers 111 and 112 are provided, where the first write driver 111 is disposed on one side of the cell array area 200 and the second write driver 112 is disposed on the other side of the cell array area 200.

The first write driver 111 includes a PMOS transistor T7 having a gate receiving a first signal DATA of a write data, and an NMOS transistor T6 having a gate receiving the first signal DATA of the write data. The second write driver 112 includes an NMOS transistor T8 having a gate receiving a second signal DATAb of the write data, and a PMOS transistor T9 having a gate the second signal DATAb of the write data.

The memory cells are arranged in the cell array area 200 in a matrix form. Referring to FIGS. 8 and 9, the first write driver 111 is disposed on a side of the cell array area 200, and the second write driver 112 is disposed on the other side of the cell array area 200.

When the write data DATA is "1", the MOS transistors T6 and T9 are turned on so that a current flows in a first direction D1 for a write operation. When the write data DATA is "0", the NMOS transistors T7 and T8 are turned on so that a current flows in a second direction D0 for the write operation.

According to an exemplary embodiment, the first write driver 111 is disposed on a side of the cell array area, and the second write driver 112 is disposed on the other side of the cell array area. In this manner, the length of the path for transferring a current supplied at a variable resistance element of a memory cell in order to store data can be the same regardless of positions of the memory cells.

In accordance with the exemplary embodiment of the present invention, a memory device may have memory cells arranged to have the same total electrical resistance on the signal transmission lines regardless of positions of the memory cells within the memory cell array.

Furthermore, the same bias current and voltage may be supplied regardless of positions of the memory cells. Thus, the memory device in accordance with the exemplary embodiment of the present invention can stably read and write data from/to memory cells.

Moreover, the same current may be supplied to all memory cells, regardless of positions of the memory cells within the memory device. Thus, an area of a driver supplying a current or voltage for a write operation may be reduced, thereby reducing an entire chip area.

While the present invention has been described with respect to the specific embodiments, it will be apparent to those skilled in the art that various changes and modifications may be made without departing from the spirit and scope of the invention as defined in the following claims.

What is claimed is:

1. A memory device including variable resistance elements comprising:
   a plurality of memory cells, each of the plurality of memory cells including a variable resistance element;
   a first write driving unit configured to transfer a first signal corresponding to a first write data to a terminal of the variable resistance element of a selected memory cell of the memory cells or receive a second signal corresponding to a second write data from the terminal of the variable resistance element; and
   a second write driving unit configured to transfer the second signal to the other terminal of the variable resistance element of the selected memory cell or receive the first signal from the other terminal of the variable resistance element.

2. The memory device of claim 1, further comprising a first transmission line arranged to couple the first terminals of the variable resistance elements of the memory cells to the first write driving unit; and
   a second transmission line arranged to couple the second write driver to the other terminals of the variable resistance elements of the memory cells.

3. The memory device of claim 2, wherein the first write driving unit and the second write driving unit are arranged opposite to each other with respect to the plurality of memory cells.

4. The memory device of claim 2, wherein the first transmission line is a bit line, the second transmission line is a source line, and the memory device further comprises a bit line sense amplifier configured to amplify a signal corresponding to read data provided through the first transmission line.

5. The memory device of claim 2, wherein a difference in a resistance in the first transmission line for a first path coupled between the first and second write driving units through the selected memory cell and a resistance in the first transmission line for a second path coupled between the first and second write driving units through a second memory cell of the memory cells substantially offsets a difference in a resistance in the second transmission line for the first path and a resistance in the second transmission line for the second path so that the total resistance of the first signal path and the total resistance of the second signal path are equal.

6. The memory device of claim 2, wherein the first write driving unit comprises:
   a first supply unit configured to supply the first signal through the first transmission line; and
   a first sinking unit configured to sink the second signal supplied through the first transmission line.

7. The memory device of claim 6, wherein the second write driving unit comprises:
   a second supply unit configured to supply the second current through the second transmission line; and
   a second sinking unit configured to sink the first current supplied through the second transmission line.

8. The memory device of claim 1, wherein the variable resistance element is at least one selected from the group of a magneto-resistance element, a phase-change element, and a ferroelectric element.

* * * * *